US006627118B2

(12) United States Patent
Kageyama et al.

(10) Patent No.: US 6,627,118 B2
(45) Date of Patent: Sep. 30, 2003

(54) NI ALLOY PARTICLES AND METHOD FOR PRODUCING SAME, AND ANISOTROPIC CONDUCTIVE FILM

(75) Inventors: Kagehiro Kageyama, Shimane-ken (JP); Koji Sato, Shimane-ken (JP)

(73) Assignee: Hitachi Metals, Ltd., Tokyo (JP)

(*) Notice: Subject to any disclaimer, the term of this patent is extended or adjusted under 35 U.S.C. 154(b) by 0 days.

(21) Appl. No.: 09/839,397

(22) Filed: Apr. 23, 2001

(65) Prior Publication Data

US 2002/0003227 A1 Jan. 10, 2002

(30) Foreign Application Priority Data

Apr. 26, 2000 (JP) .......................... 2000-125872

(51) Int. Cl.⁷ .............. H01B 5/16; H05K 1/09; B22F 9/24
(52) U.S. Cl. .............. 252/513; 252/511; 252/513; 252/519.1; 252/521.2; 428/680; 428/626; 428/936; 427/98; 420/441; 205/187; 205/794; 423/23; 423/138; 423/289; 423/305
(58) Field of Search .............. 252/519.1, 520.22, 252/520.3, 521.2; 423/23, 87, 89, 111, 138, 289, 306; 502/420; 428/680, 626, 936; 427/98; 420/441; 205/794, 187

(56) References Cited

FOREIGN PATENT DOCUMENTS

| JP | 63-274706 | 11/1988 | .............. B22F/9/24 |
| JP | 08273440 | * 10/1996 | |
| JP | 08-273440 | 10/1996 | .............. H01B/5/16 |
| JP | 2000-313906 | 11/2000 | .............. B22F/9/24 |

OTHER PUBLICATIONS

Shen et al, "Microcalorimetric Studies of CO and H2 Adsorption on Nickel, Nickel–Boride and Nickel–Phosphide Catalysts", Langmuir, 1997, (13) 2735–2739.*

Lee et al, "Selective Hydrogenation of furfural on Ni–P, Ni–B, and Ni–P–B Ultrafine Materials", Ind. Eng. Chem. Res, 1999, (38) 2548–2556.*

Vtina et al, "Structure and phase stability of the chemically deposited Au layers on electrodeposited Ni and Ni–B layers", Surface and Coatings Technology, 1999, (120–121) 430–437.*

Lee et al, "Effects of Preparation and Catalyticf Properties of Ni–B–P Ultrafine Materials", Ind. Eng. Chem. Res. 2001, (40) 1495–1499.*

* cited by examiner

Primary Examiner—Yogendra N. Gupta
Assistant Examiner—Kallambella Vijayakumar
(74) Attorney, Agent, or Firm—Sughrue Mion, PLLC

(57) ABSTRACT

A crystalline Ni alloy particle for an anisotropic conductive film comprising Ni and a metalloid element such as P, B, etc. and having a structure in which a Ni intermetallic compound phase is precipitated can be produced by preparing substantially amorphous Ni alloy particle by an electroless reduction method, and heat-treating the substantially amorphous Ni alloy particle. The Ni alloy particle is preferably heat-treated after disintegration, and preferably coated with Au.

8 Claims, 3 Drawing Sheets

1 μm

1 μm

NI ALLOY PARTICLES AND METHOD FOR PRODUCING SAME, AND ANISOTROPIC CONDUCTIVE FILM

FIELD OF THE INVENTION

The present invention relates to Ni alloy particles for anisotropic conductive film, and a method for producing such Ni alloy particles and an anisotropic conductive film comprising such Ni alloy particles.

BACKGROUND OF THE INVENTION

Anisotropic conductive films are mostly used for electric connection between electrodes (ITO) of displays such as liquid crystal displays, organic EL displays, etc. for electronics appliances such as personal computers and portable communications equipment and terminals of semiconductors and between electrodes of tape carrier packages (TCP) and electrodes of printed circuit boards (PCB), etc. Anisotropic conductive films are thin films made of resins in which fine conductive particles are dispersed, and inserted between opposing electrodes (electrodes to be connected) and pressed to achieve electric conduction therebetween. Though fine conductive particles are dispersed in the resins with such distance therebetween as to make the films non-conductive, particles trapped between electrodes to be connected by pressing constitute conduction paths. Therefore, only the opposing electrodes are electrically conducted, while keeping insulation between electrodes that should not be connected.

Conventionally used as conductive particles for anisotropic conductive films are resin particles having metal plating. To reduce electric resistance at the time of connection, proposal has recently been made to use as conductive particles powder of Ni, Cu, Au, Ag or alloys thereof, particularly powder of Ni or alloys thereof.

However, not only are metal-plated resin particles expensive, but also the resin particles are insufficient in hardness to destroy or pierce oxide layers on electrodes. Further, the metal-plated resin particles are poor in conductivity only with metal plating, because the resin particles are insulating.

To solve these problems, Japanese Patent Laid-Open No. 8-273440 proposes the use of powder of Ni, Cu, Au, Ag or alloys thereof as conductive particles. Japanese Patent Laid-Open No. 8-273440 describes that among these conductive particles, Au is expensive, Ag causes migration, Cu is so easily oxidized that its conductivity is deteriorated, and Ni is so easily oxidized and hard to deform that it cannot provide stable electric connection when used as conductive particles for anisotropic conductive films, and that Cu—Ag alloy powder produced by a gas atomizing method is most preferable because it is excellent in oxidation resistance and the suppression of migration.

However, alloy powder produced by a gas atomizing method has a relatively large particle size, suffering from the disadvantage that extremely low yield is provided to produce alloy powder having as small a particle size as 10 μm or less, for instance. There is also likelihood of oxidation and migration in the Cu—Ag alloy powder.

To ensure electric conduction in the anisotropic conductive film, there are a method (1) of using low-hardness conductive particles to expand a contact area of the conductive particles with electrodes by the deformation of the conductive particles, and a method (2) of using high-hardness conductive particles to destroy an oxide layer formed on an electrode surface. The proposal of Japanese Patent Laid-Open No. 8-273440 is based on the method (1). It has been found, however, that the method (1) cannot necessarily provide secure electric conduction.

To adopt the method (2), investigation has been conducted with respect to a method for increasing the hardness of conductive particles. It has thus been found that when pure Ni particles less likely to generate migration are used as conductive particles, pure Ni particles are easily oxidized, and neither sufficiently soft to expand the contact area by deformation, nor hard to penetrate an oxide layer on an electrode surface, as described in Japanese Patent Laid-Open No. 8-273440, failing to provide stable electric conduction.

As a result of investigation on the composition of an Ni alloy capable of having high hardness and a method for efficiently producing fine, uniform conductive particles as small as 10 μm or less, which cannot easily be obtained by an atomizing method, it has been found that (1) the addition of a metalloid element is effective for high hardness, (2) Ni alloy particles having a particle size that is as small as 10 μm or less and uniform, which cannot easily be obtained by an atomizing method, can be produced by an electroless reduction method, (3) though Ni alloy particles produced by an electroless reduction method are substantially amorphous and fine with high hardness, they cannot be used for powder for anisotropic conductive films because of high electric resistance, and (4) to have necessary hardness for surely penetrating an oxide layer on an electrode, further increase in hardness should be achieved.

OBJECT OF THE INVENTION

Accordingly, an object of the present invention is to provide Ni alloy particles capable of forming an anisotropic conductive film that provides good electric conduction in contact with electrodes by pressing.

Another object of the present invention is to provide a method for producing such Ni alloy particles.

A further object of the present invention is to provide an anisotropic conductive film comprising such Ni alloy particles.

DISCLOSURE OF THE INVENTION

As a result of intense research in view of the above objects, the inventors have found that high-hardness, low-electric resistance powder for an anisotropic conductive film can be obtained by preparing substantially amorphous Ni alloy particle by an electroless reduction method, and heat-treating the substantially amorphous Ni alloy particle to precipitate a Ni intermetallic compound phase in the alloy structure. The present invention is based on this finding.

Thus, the Ni alloy particle for an anisotropic conductive film according to the present invention is a crystalline Ni alloy particle comprising Ni and a metalloid element and having a structure in which a Ni intermetallic compound phase is precipitated.

In a preferred embodiment of the present invention, the Ni intermetallic compound is $Ni_3P$ or $Ni_3B$. The Ni alloy particle is substantially spherical, having a particle size distribution with $d_{90}$ of 10 μm or less, wherein $d_{90}$ is defined as a particle size of 90% of powder in an accumulative distribution curve. The Ni alloy particle is coated with Au.

The method for producing a Ni alloy particle for an anisotropic conductive film according to the present invention comprises the steps of preparing substantially amorphous, fine Ni alloy particle by an electroless reduction method, and heat-treating the substantially amorphous, fine Ni alloy particle.

In a preferred embodiment of the present invention, heat treatment is carried out after disintegrating the substantially amorphous Ni alloy particle produced by the electroless reduction method. Further preferably, the heat-treated Ni alloy particle is coated with Au.

The anisotropic conductive film of the present invention comprises crystalline Ni alloy particles uniformly dispersed in a resin, the crystalline Ni alloy particles comprising Ni and a metalloid element and having a structure in which a Ni intermetallic compound phase is precipitated. The content of the Ni alloy particles is preferably 1–20% by weight, more preferably 2–10% by weight, based on the total amount (100% by weight) of the film.

DESCRIPTION OF THE PREFERRED EMBODIMENTS

Figure 1A:
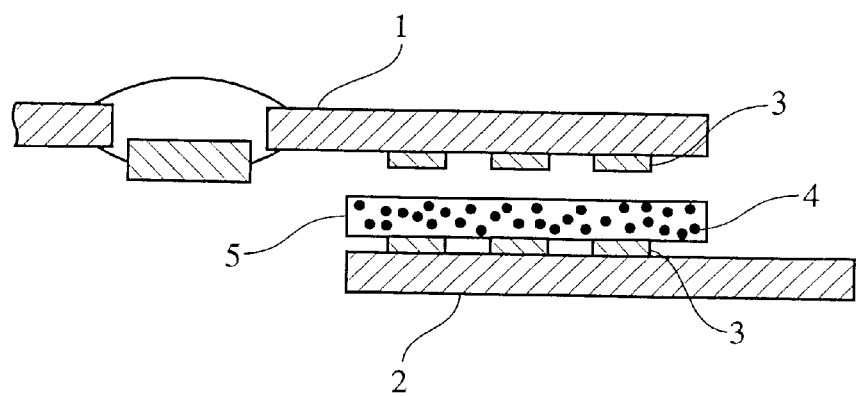
FIG. 1(a) is a cross-sectional view showing an anisotropic conductive film disposed between electrodes.

The important feature of the present invention is to use crystalline Ni alloy particles comprising Ni and a metalloid element and having a structure in which a Ni intermetallic compound phase is precipitated, as conductor particles for anisotropic conductive films.

[1] Ni alloy particle

The Ni alloy particle of the present invention for an anisotropic conductive film comprises Ni and a metalloid element and has a crystalline metal structure.

The Ni alloy particle of the present invention is obtained by crystallizing substantially amorphous Ni alloy particle. The substantially amorphous Ni alloy particle has high electric resistivity because of a Kondo effect due to a transformation interaction between conduction electron and local moment, though the above effect disappears by crystallization, resulting in decrease in electric resistivity. The term "substantially amorphous" used herein means a structure exhibiting a broad Ni peak in an X-ray diffraction pattern.

The term "metalloid element" used herein means an element such as C, B, P, Si, As, Te, Ge, Sb, etc., which functions to make the Ni alloys amorphous and higher in hardness. The metalloid elements suitable for the present invention are C, B and P, which are capable of forming intermetallic compounds with Ni. The content of the metalloid element is preferably 3–14% by weight based on the total amount (100% by weight) of the Ni alloy particle. When the content of the metalloid element is less than 3% by weight, substantially amorphous Ni alloy particles cannot be obtained. On the other hand, when the content of the metalloid element is more than 14% by weight, the resultant Ni alloy particles have excessively high electric resistivity. The more preferable content of the metalloid element is 5–12% by weight.

P has functions not only to make it easy to produce spherical Ni alloy particles, but also to precipitate a fine intermetallic compound of $Ni_3P$ by crystallization by heat treatment, thereby making the Ni alloy particles extremely higher in hardness. B also has a function to precipitate an extremely hard intermetallic compound of $Ni_3B$.

The Ni alloy particles of the present invention may contain other elements than Ni and the metalloid elements, such as O, N, S, etc., which are inevitably included in the course of production, in a range within 1% by weight based on the total amount of the alloy.

The Ni alloy particles of the present invention are preferably substantially spherical with $d_{90}$ of 10 μm or less, wherein $d_{90}$ is defined as a particle size of powder occupying 90% of the total volume in an accumulative distribution curve. Having a particle size distribution with $d_{90}$ of 10 μm or less, Ni alloy particles are less likely to be in contact with each other in the anisotropic conductive film, improving reliability in insulation between adjacent electrodes even in small-pitch connection and thus making short-circuiting less likely, thereby enabling the anisotropic conductive film to become thinner.

Using the Ni alloy particles with $d_{90}$ of 5 μm or less, the anisotropic conductive film can be made further thinner, thereby achieving smaller pitch. However, with too small a particle size, the Ni alloy particles are rather likely to be in contact with each other (short-circuiting). Therefore, the preferred lower limit of $d_{90}$ of the Ni alloy particles is 2 μm.

If the Ni alloy particles are spherical, they can be dispersed uniformly in the resin, thereby ensuring non-conductivity (insulation) of the anisotropic conductive film in a plane direction. Meeting the conditions of being spherical and "$d_{90}$ of 10 μm or less," a large number of Ni alloy particles can be brought into contact with each other between the opposing electrodes by pressing the anisotropic conductive film, thereby surely providing good conduction. It should be noted that "being spherical" is not restricted to a true sphere but includes being elliptic, and that spheres may have projections or recesses to some extent or may be bonded to each other.

[2] Production Method of Ni Alloy Particles

Substantially amorphous Ni alloy particles are produced by an electroless reduction method. Making substantially amorphous Ni alloy particles, higher hardness is achieved. The reasons for using the electroless reduction method for producing substantially amorphous Ni alloy particles are: (1) powder can easily be produced by the electroless reduction method because Ni constituting a matrix phase has a low standard electrode potential, (2) alloys of Ni and metalloid elements such as P, etc. can easily be formed in an amorphous state, (3) the resultant Ni alloy particles are substantially spherical, and (4) the resultant Ni alloy particles are substantially free from anisotropy.

In general, an electroless reduction method is carried out by mixing an alkali salt such as sodium hydroxide with a salt or acid of a metalloid element such as phosphoric acid, and then with a nickel salt. The electroless reduction method is preferably carried out in a wet state, namely in an aqueous solution. Specifically, using a wet-electroless reduction method, in which a sodium hydroxide aqueous solution is mixed with a phosphoric acid aqueous solution, and then with an aqueous solution of a nickel salt such as nickel chloride, substantially amorphous, fine nickel-phosphorus (Ni—P) alloy particles can be produced. Using a boric acid aqueous solution instead of a phosphoric acid aqueous solution, substantially amorphous nickel-boron (Ni—B) alloy particles may be produced. By adjusting the amount of a phosphoric acid aqueous solution or a boric acid aqueous solution, it is possible to control the size of the resultant Ni alloy particles.

The Ni alloy particles produced by the wet-electroless reduction method may be directly heat-treated to form crystalline Ni alloy particles. However, if the Ni alloy particles were in a coagulated state, non-conductivity (insulation) would not be able to be surely kept in the anisotropic conductive film in a plane direction because of contact of particles with each other. Therefore, it is desirable to disintegrate the coagulated Ni alloy particles to separate particles. The disintegration makes the particle size of the Ni alloy particles more uniform. A treatment for making separate particles may use a jet mill, air classification or both.

The heat treatment of the substantially amorphous Ni alloy particles can form Ni alloy particles having a fine crystal structure with higher hardness than that of the substantially amorphous Ni alloy particles. The crystalline Ni alloy particles not only have enough hardness to surely destroy an oxide layer on an electrode surface, but also provide the anisotropic conductive film with excellent electric resistance in a plane direction.

The heat treatment conditions (temperature and time period) are set such that both crystallization and the precipitation of a Ni intermetallic compound take place, and specifically they are preferably 350–450° C. for several tens of minutes to several hours. With this heat treatment, it is possible to obtain Ni alloy particles having as small a particle size as 10 $\mu$m or less, in which for instance $Ni_3P$ or $Ni_3B$ is precipitated as intermetallic compounds.

Though the heat-treated Ni alloy particles may be used without further treatment, the Ni alloy particles may be coated with Au to reduce resistance in contact of electrodes. An Au coating layer may be as thin as 1 $\mu$m or less to fully lower the contact resistance. The formation of an Au coating layer can be carried out by plating of Au.

[3] Anisotropic Conductive Film

The anisotropic conductive film of the present invention is a thin film comprising the above fine, crystalline Ni alloy particles dispersed uniformly in a resin. The resin may be any of thermoplastic resins and thermosetting resins, and the thermosetting resins are preferable from the aspect of shape stability (dimension accuracy) and bonding strength. The thermosetting resins may be unsaturated polyester resins, epoxy resins, thermosetting bisphenol resins, etc. The content of the Ni alloy particles in the anisotropic conductive film is preferably 1–20% by weight based on the total amount (100% by weight). When the content of the Ni alloy particles is less than 1% by weight, sufficient connection cannot be obtained between electrodes even after hot pressing. On the other hand, when the content of the Ni alloy particles exceeds 20% by weight, the anisotropic conductive film looses insulation. The more preferable content of the Ni alloy particles is 2–10% by weight.

In the preferred production method of the anisotropic conductive film, Ni alloy particles are first blended with a thermosetting resin, formed into a thin film by a casting method, etc. and slightly heated to provide a half-cured, anisotropic conductive film. The anisotropic conductive film is preferably as thin as 10–50 $\mu$m. The half-cured, anisotropic conductive film is disposed between opposing electrodes (electrodes to be connected) and hot-pressed to soften the thermosetting resin, thereby bringing the opposing electrodes into contact with each other via Ni alloy particles. The temperature and pressure for hot pressing may properly be determined depending on the type of the thermosetting resin. Because the Ni alloy particles are extremely hard, oxide layers on the electrodes are destroyed, providing good conduction between the opposing electrodes via Ni alloy particles. Because the Ni alloy particles uniformly dispersed in the anisotropic conductive film keep their distance after hot pressing, electrodes that should not be connected to each other are not brought into electric conduction with each other.

The present invention will be described in detail below referring to the following examples, without intention of restricting the scope of the present invention defined by the claims attached hereto.

EXAMPLE 1

10 L of a 0.6-mol/L sodium hydroxide aqueous solution was fully mixed with 10 L of a 1.8-mol/L sodium hypophosphate aqueous solution, heated at 80° C., and then mixed with 10 L of a 0.6-mol/L nickel chloride aqueous solution to form fine Ni alloy particles. It was confirmed by X-ray diffraction that the resultant fine Ni alloy particles were substantially amorphous as shown in FIG. 2(a).

The fine Ni alloy particles were disintegrated by a jet mill and measured for a particle size by a laser diffraction method, resulting in $d_{90}$ of 4.2 $\mu$m. Thereafter, heat treatment was carried out at 400° C. for 80 minutes to obtain crystalline Ni alloy particles, in which fine Ni and $Ni_3P$ phases were precipitated as shown in FIG. 2(b).

Figure 2A:
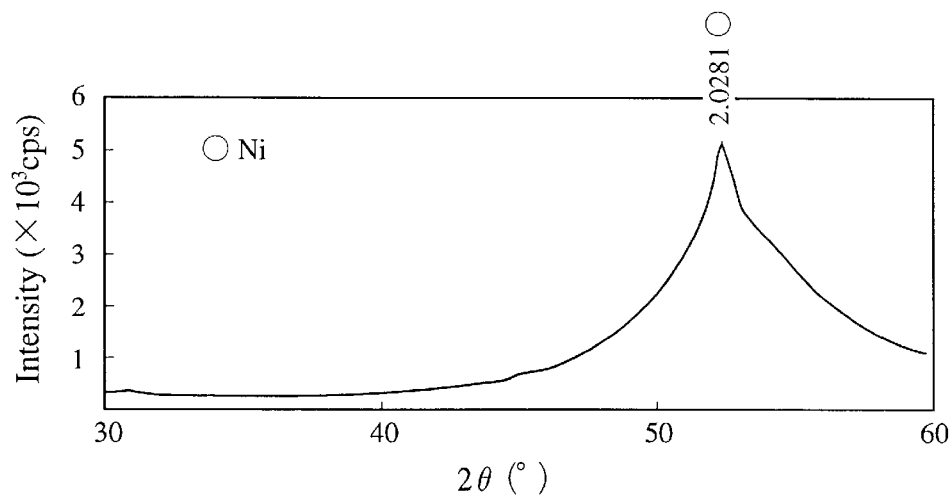
FIG. 2(a) is a graph showing an X-ray diffraction pattern of substantially amorphous NiP alloy particles.
Figure 2B:
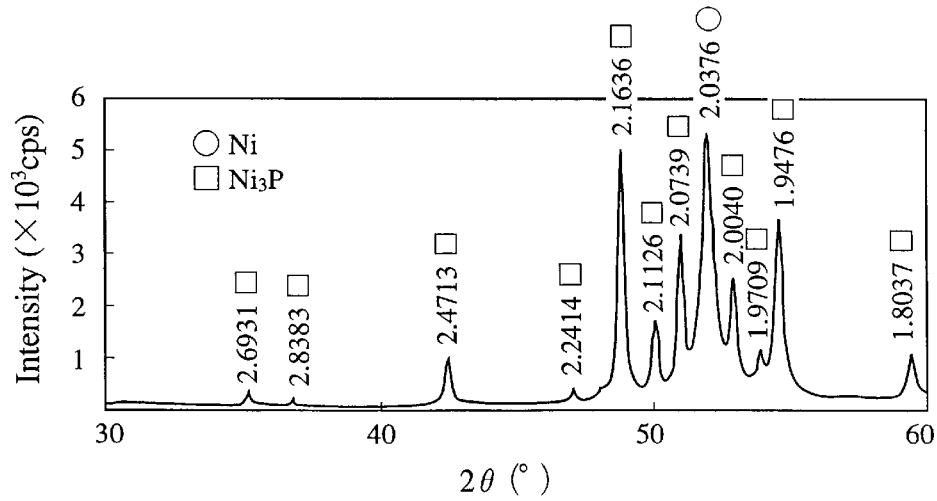
FIG. 2(b) is a graph showing an X-ray diffraction pattern of crystalline NiP alloy particles.
Figure 3A:
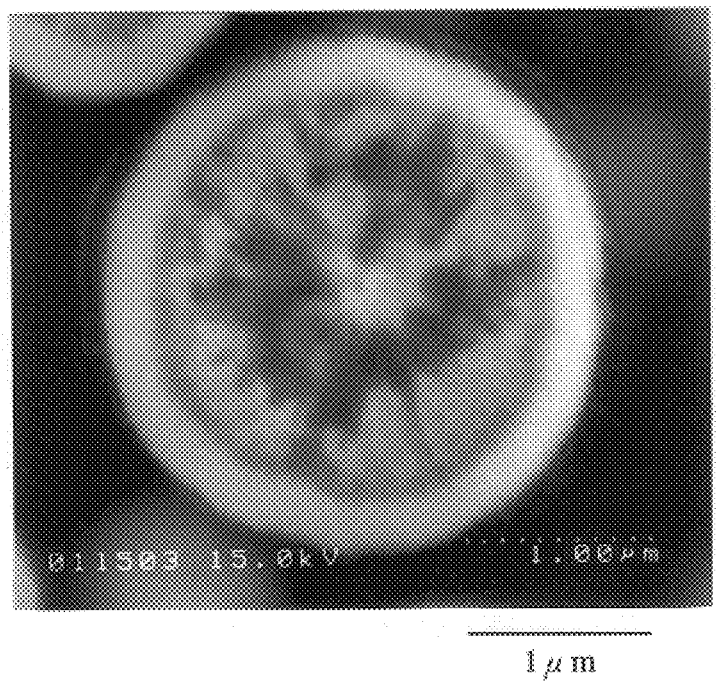
FIG. 3(a) is an electron photomicrograph of substantially amorphous Ni alloy particles in cross section.
Figure 3B:
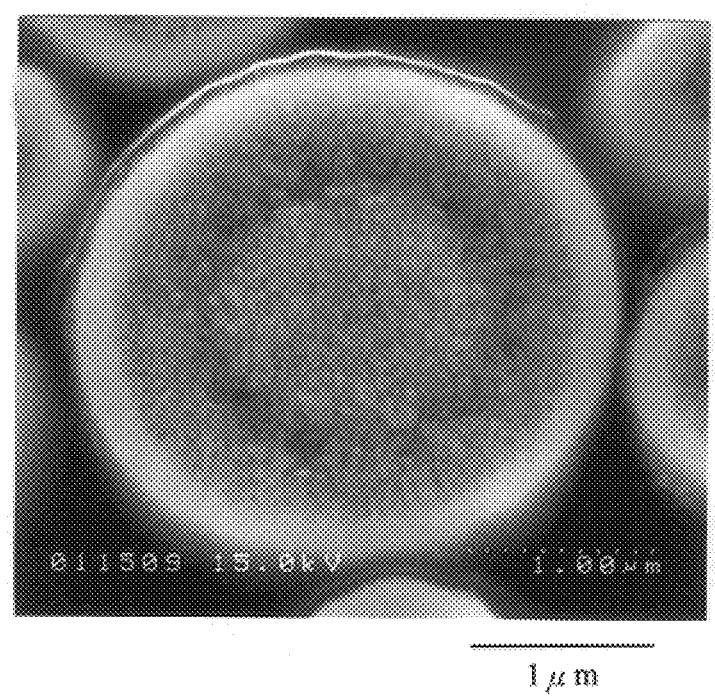
FIG. 3(b) is an electron photomicrograph of crystalline Ni alloy particles in cross section.

The electron microscopic observation of the substantially amorphous Ni alloy particles shown in FIG. 2(a) in cross section revealed that they had a substantially amorphous structure almost entirely as shown in FIG. 3(a). Though Ni nucleus should exist at a center of the Ni alloy particle, it was not appreciated in the electron photomicrograph. Incidentally, it looks as if the Ni alloy particle has an inner layer and an outer layer in its cross section, due to a distribution in the concentration of P. On the other hand, the electron microscopic observation of the crystalline Ni alloy particles shown in FIG. 2(b) in cross section revealed that there was a finely precipitated $Ni_3P$ phase as shown in FIG. 3(b).

1 part by weight of the above crystalline Ni alloy particles was blended with 25 parts by weight of a thermosetting bisphenol resin and 2 parts by weight of an imidazole hardener to form a composition, which was formed into an anisotropic conductive film 5 of 20 $\mu$m in thickness. In the resultant anisotropic conductive film 5, fine Ni alloy particles 4 were uniformly dispersed as shown in FIG. 1(a).

Figure 1B:
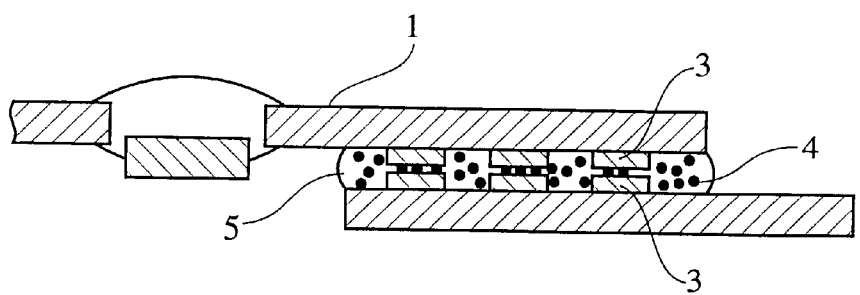
FIG. 1(b) is a cross-sectional view showing a pair of electrodes bonded to each other by hot pressing via an anisotropic conductive film.

With this anisotropic conductive film 5 placed between electrodes 3 mounted onto a tape carrier package (TCP) 1 and electrodes 3 mounted onto a resin board 2, they were hot-pressed under the conditions of 170° C. and 3 MPa for 20 seconds to provide a sample in a contact state as shown in FIG. 1(b).

The sample was kept at a temperature of 60° C. and at a humidity of 90% for a high-temperature, high-humidity durability test to determine how well the electrodes were connected in the sample. As a result, resistance between the electrodes connected was sufficiently as low as 18 Ω even after 500 hours, while the sample exhibited insulation (resistance of the anisotropic conductive film 5 in a plane direction) of as high as $1\times10^9$ Ω or more.

EXAMPLE 2

10 L of a 0.6-mol/L sodium hydroxide aqueous solution was fully mixed with 10 L of a 2.4-mol/L sodium hypophosphate aqueous solution, heated at 60° C., and then mixed with 10 L of a 0.6-mol/L nickel chloride aqueous solution to form fine Ni alloy particles. It was confirmed by X-ray diffraction that the resultant fine Ni alloy particles were substantially amorphous. The fine Ni alloy particles were disintegrated by a jet mill and measured for a particle size by a laser diffraction method, resulting in $d_{90}$ of 3.1 $\mu$m. Thereafter, the fine Ni alloy particles were subjected to heat treatment at 400° C. for 80 minutes to obtain crystalline Ni alloy particles, in which fine Ni and $Ni_3P$ phases were precipitated.

After treating the crystalline Ni alloy particles with 5% hydrochloric acid, electroless Au plating was carried out for 30 minutes and washed with water to provide the Ni alloy particles with a plating layer of 0.5 $\mu$m in thickness.

1 part by weight of the Au-plated, crystalline Ni alloy particles was blended with 25 parts by weight of a thermosetting bisphenol resin and 2 parts by weight of an imidazole hardener to form a composition, which was formed into an anisotropic conductive film 5 of 20 $\mu$m in thickness. In the resultant anisotropic conductive film 5, fine Ni alloy particles 4 were uniformly dispersed as shown in FIG. 1(a). With this anisotropic conductive film 5 placed between electrodes 3 mounted onto TCP 1 and electrodes mounted onto a resin board 2, they were hot-pressed under the conditions of 170° C. and 3 MPa for 20 seconds to provide a sample in a contact state as shown in FIG. 1(b).

The sample was subjected to a high-temperature, high-humidity durability test under the same conditions as in EXAMPLE 1 to measure resistance in contact of electrodes after keeping for 500 hours. As a result, resistance between the electrodes connected was sufficiently as low as 8 $\Omega$, while the anisotropic conductive film 5 exhibited insulation of as high as 1 ×10$^9$ $\Omega$ or more.

COMPARATIVE EXAMPLE 1

10 L of a 0.6-mol/L sodium hydroxide aqueous solution was fully mixed with 10 L of a 2.4-mol/L sodium hypophosphate aqueous solution, heated at 70° C., and then mixed with 10 L of a 0.6-mol/L nickel chloride aqueous solution to form fine Ni alloy particles. It was confirmed by X-ray diffraction that the resultant fine Ni alloy particles ere substantially amorphous. The fine Ni alloy particles were disintegrated by a jet mill and measured for a particle size by a laser diffraction method, resulting in $d_{90}$ of 2.9 $\mu$m.

1 part by weight of the substantially amorphous Ni alloy particles was blended with 25 parts by weight of a thermosetting bisphenol resin and 2 parts by weight of an imidazole hardener to form a composition, which was formed into an anisotropic conductive film 5 to 20 $\mu$m in thickness. With the resultant anisotropic conductive film 5 placed between electrodes 3 mounted onto TCP 1 and electrodes 3 mounted onto a resin board 2 as shown in FIG. 1(a), they were hot-pressed under the conditions of 170° C. and 3 MPa for 20 seconds to provide a sample in a contact state as shown in FIG. 1(b).

The sample was subjected to a high-temperature, high-humidity durability test under the same conditions as in EXAMPLE 1 to measure resistance in contact of electrodes after keeping for 500 hours. As a result, it was as high as 60 $\Omega$. Incidentally, the insulation of the anisotropic conductive film 5 was as high as 1 ×10$^9$ $\Omega$ or more.

As is clear from EXAMPLES 1 and 2 and COMPARATIVE EXAMPLE 1, the crystalline Ni alloy particles of the present invention are extremely lower in resistance in contact of electrodes by pressing than the amorphous Ni alloy particles, though they exhibit substantially the same insulation when dispersed in anisotropic conductive films. Accordingly, the Ni alloy particles of the present invention are suitable as conductive particles for anisotropic conductive films.

What is claimed is:

1. An anisotropic conductive film comprising crystalline Ni alloy particles uniformly dispersed in a resin, said crystalline Ni alloy particles comprising Ni and a metalloid element and having a structure in which an Ni intermetallic compound phase with said metalloid element is precipitated.

2. The anisotropic conductive film according to claim 1, wherein the content of said Ni alloy particles is 1–20% by weight based on the total amount (100% by weight) of said film.

3. The anisotropic conductive film according to claim 1, wherein said Ni intermetallic compound with said metalloid element is $Ni_3P$ or $Ni_3B$.

4. The anisotropic conductive film according to claim 1, wherein said Ni alloy particles are substantially spherical, having a particle size distribution with $d_{90}$ of 10 $\mu$m or less, wherein $d_{90}$ is defined as a particle size of 90% of powder in an accumulative distribution curve.

5. The anisotropic conductive film according to claim 1, wherein said Ni alloy particles are coated with Au.

6. A method for producing an anisotropic conductive film, comprising the steps of preparing substantially amorphous Ni alloy particles by an electroless reduction method, heat-treating said substantially amorphous Ni alloy particles and thereafter subjecting said heat-treated Ni alloy particles to uniformly disperse said heat-treated Ni alloy particles in a resin.

7. The method for producing an anisotropic conductive film according to claim 6, wherein said heat-treating is carried out after disintegrating said substantially amorphous Ni alloy particles.

8. The method for producing an anisotropic conductive film according to claim 6, wherein said heat-treated Ni alloy particles are coated with Au.

* * * * *